(12) United States Patent
Young et al.

(10) Patent No.: US 6,489,631 B2
(45) Date of Patent: Dec. 3, 2002

(54) LIGHT-EMITTING MATRIX ARRAY DISPLAY DEVICES WITH LIGHT SENSING ELEMENTS

(75) Inventors: Nigel D. Young, Redhill (GB); John M. Shannon, Whyteleafe (GB)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/863,566

(22) Filed: May 23, 2001

(65) Prior Publication Data

US 2001/0052597 A1 Dec. 20, 2001

(30) Foreign Application Priority Data

Jun. 20, 2000 (GB) ............................................ 0014961

(51) Int. Cl.[7] ......................................... H01L 31/0376
(52) U.S. Cl. .............................. 257/59; 257/57; 257/72; 257/291
(58) Field of Search ............................... 257/57, 59, 61, 257/66, 72, 291, 382, 411; 395/500; 345/76, 92, 173

(56) References Cited

U.S. PATENT DOCUMENTS

| | | | | |
|---|---|---|---|---|
| 5,386,543 A | * | 1/1995 | Bird | ............................ 358/1.1 |
| 5,640,067 A | * | 6/1997 | Yamauchi et al. | ........... 313/504 |
| 5,684,365 A | * | 11/1997 | Tang et al. | .................. 257/448 |
| 5,773,844 A | * | 6/1998 | Kawamura et al. | .......... 257/411 |
| 5,838,308 A | * | 11/1998 | Knapp et al. | ................ 345/173 |
| 6,160,272 A | * | 12/2000 | Arai et al. | .................... 257/291 |

FOREIGN PATENT DOCUMENTS

| | | | | |
|---|---|---|---|---|
| EP | 0717446 | 6/1996 | ........... H01L/27/15 |
| WO | WO9636959 | 11/1996 | ............. G09G/3/30 |
| WO | WO9965012 | 12/1999 | ............. G09G/3/30 |

* cited by examiner

*Primary Examiner*—David Nelms
*Assistant Examiner*—Dao H. Nguyen

(57) ABSTRACT

A display device has an array of pixels comprising light emitting display elements, for example EL elements, carried on a substrate and associated light sensing elements responsive to light emitted by the display elements. The light sensing elements each comprise a gated photosensitive thin film device such as a TFT structure or a lateral gated pin device having a semiconductor layer with contact regions laterally spaced on the substrate and separated by a gate controlled region. A part of the associated display element extends over the gate controlled region with an electrode of the display element serving as the gate of the photosensitive device thereby ensuring good optical coupling between the display element and the photosensitive device and enabling the gate to be appropriately biased. Such an arrangement enables, for example, the provision of electro-optic feedback control in the pixel in comparatively simple manner.

14 Claims, 4 Drawing Sheets

LIGHT-EMITTING MATRIX ARRAY DISPLAY DEVICES WITH LIGHT SENSING ELEMENTS

FIELD OF TECHNOLOGY

This invention relates to light emitting matrix array display devices with light sensing elements. More particularly, the invention is concerned with a matrix array display device comprising an array of addressable pixels comprising light-emitting display elements, and light sensing elements. The invention is concerned especially, but not exclusively, with matrix display devices using electroluminescent display elements, particularly organic electroluminescent display elements, OLEDs, including polymer electroluminescent elements, PLEDs.

BACKGROUND AND SUMMARY

An example of matrix display device whose pixels comprise electroluminescent (EL) display elements and light sensing elements is described in British Application No 0005811.5. The described device comprises an active matrix display device having an array of pixels carried on a substrate, in which each pixel includes a current-driven electroluminescent display element comprising light emitting EL material between two electrodes, one of which is transparent, and a switching device operable to control the current through the display element, and hence its light output, in a drive period based on a drive (data) signal applied to the pixel in a preceding address period.

As in other active matrix EL display devices, such as the device described in EP-A-0717446, the display elements, which need to continuously pass current in order to generate a light output, can be energised for an extended period, up to a frame time, following the addressing of the pixel in a respective row address period with the level of the data signal stored in the pixel in the address period determining its output during this drive period. The driving device, in the form of a thin film transistor (TFT), is responsible for controlling the current through the display element and the applied data signal is stored as a charge on a capacitance coupled to the gate of this drive TFT so that the operation of the TFT is dependent on the stored charge.

The pixels in the device of British Patent Application No 0005811.5 further include a thin film photosensitive device, comprising a (PiN) photodiode or a photo-responsive TFT coupled to the storage capacitance that is arranged in operation of the pixel to be reverse biased and is responsive to light emitted by the pixel's display element in the drive period so as to leak charge from the capacitance at a rate dependent on the display element's light output level. Thus, by virtue of the photo sensitive device, opto-electronic feedback is provided which progressively adjusts the operation of the drive TFT controlling energisation of the display element during the drive period to reduce the current flow through the display element, and hence its light output, by progressively discharging the capacitance (assuming it is charged upon addressing). The proportion of the total available drive period for which the display element is energised is, therefore, dependent on, and regulated by, this feedback arrangement according to the element's light output. In this way the integrated light output from a display element in a drive (frame) period can be controlled so as, inter alia, to counteract any effects of ageing or degradation in the display element's electroluminescent material, particularly a reduction in light output level for a given drive current level, which can occur over a period of time of operation, and also to compensate for the effects of voltage drops occurring in current carrying lines supplying the pixels.

Such a technique is valuable in achieving a high quality display by ensuring that pixel light outputs can be constant and uniform over time. However, the implementation of such a pixel circuit can be problematic. The photocurrent generated by the photosensitive device needs to be very small in order to appropriately control the TFT gate potential over a frame period if the use of a large storage capacitance is to be avoided. Also, the provision in each pixel circuit of the light sensitive element using thin film technology ideally should not unduly complicate fabrication while at the same time good optical coupling between the light-emitting display element and the light sensing element needs to be ensured.

According to the present invention, there is provided a light emitting display device comprising on a substrate an array of addressable pixels each comprising a light-emitting display element having a layer of light-emitting material with a transparent electrode on one side thereof, and a light sensing element responsive to light emitted by the display element, wherein each light sensing element comprises a gated photosensitive thin film device comprising a semiconductor layer having contact regions laterally spaced on the substrate and an intervening gate controlled region over which dielectric material is disposed, and wherein a part of the light-emitting display element extends over the dielectric material and the gate controlled region such that the transparent electrode of the light-emitting display element at that part serves as the gate of the photosensitive device and light emitted by the light-emitting material layer is incident on the semiconductor layer.

With this arrangement, the provision of the light sensing element is relatively uncomplicated while at the same time good optical coupling between this component and the light-emitting material of the display element is reliably ensured. Such an arrangement, therefore, is highly beneficial when used, for example, in the kind of display device described in the aforementioned application No 0005811.5. The basic structure of the gated photosensitive device is generally similar to that of TFTs commonly used in matrix display devices, e.g. the driving TFTs of the aforementioned display device. In this respect, the gated photosensitive device may comprise a TFT or a gated lateral (pin) diode. The provision of this component is, therefore, entirely compatible with the thin film technology used for matrix display devices and the device can easily be formed simultaneously with such TFTs from common thin film layers. Because a part of the light-emitting element extends over the photo device and the active region of the device is directly and closely associated with the light-emitting material, then the device is highly responsive to variations in light output from the light-emitting material. Moreover, as a part of the electrode of the light-emitting element is utilised for the gate of the photosensitive device, then the gate potential of this device, corresponding to the potential of this electrode in operation of the device, can conveniently be biased appropriately during operation such that it behaves as a photosensitive leakage device by virtue of photocurrents generated therein in response to light incident from the light-emitting layer in the manner required for this component when used as a charge adjusting device in the display device of the aforementioned type.

While the invention is particularly beneficial in the implementation of the particular kind of pixel circuit discussed above, it is envisaged that it can be used to advantage in other light emitting matrix display devices in which pixels include a light sensing device responsive to the light emission of the pixel's display element for another purpose rather than being used in the particular manner described.

The light-emitting elements preferably comprise electroluminescent elements, such as OLED or PLED elements. However, it is envisaged that the invention could be used to similar advantage in display devices using other kinds of light-emitting elements and not necessarily in the case of the light sensing element being used as part of an electro-optic feedback arrangement in the manner described.

BRIEF DESCRIPTION OF THE DRAWING FIGURES

Embodiments of light-emitting display devices in accordance with the invention, and in particular active matrix EL display devices, will now be described, by way of example, with reference to the accompanying drawings in which.

The Figures are merely schematic. The same reference numbers are used throughout the Figures to denote the same or similar parts.

DETAILED DESCRIPTION

Figure 1:
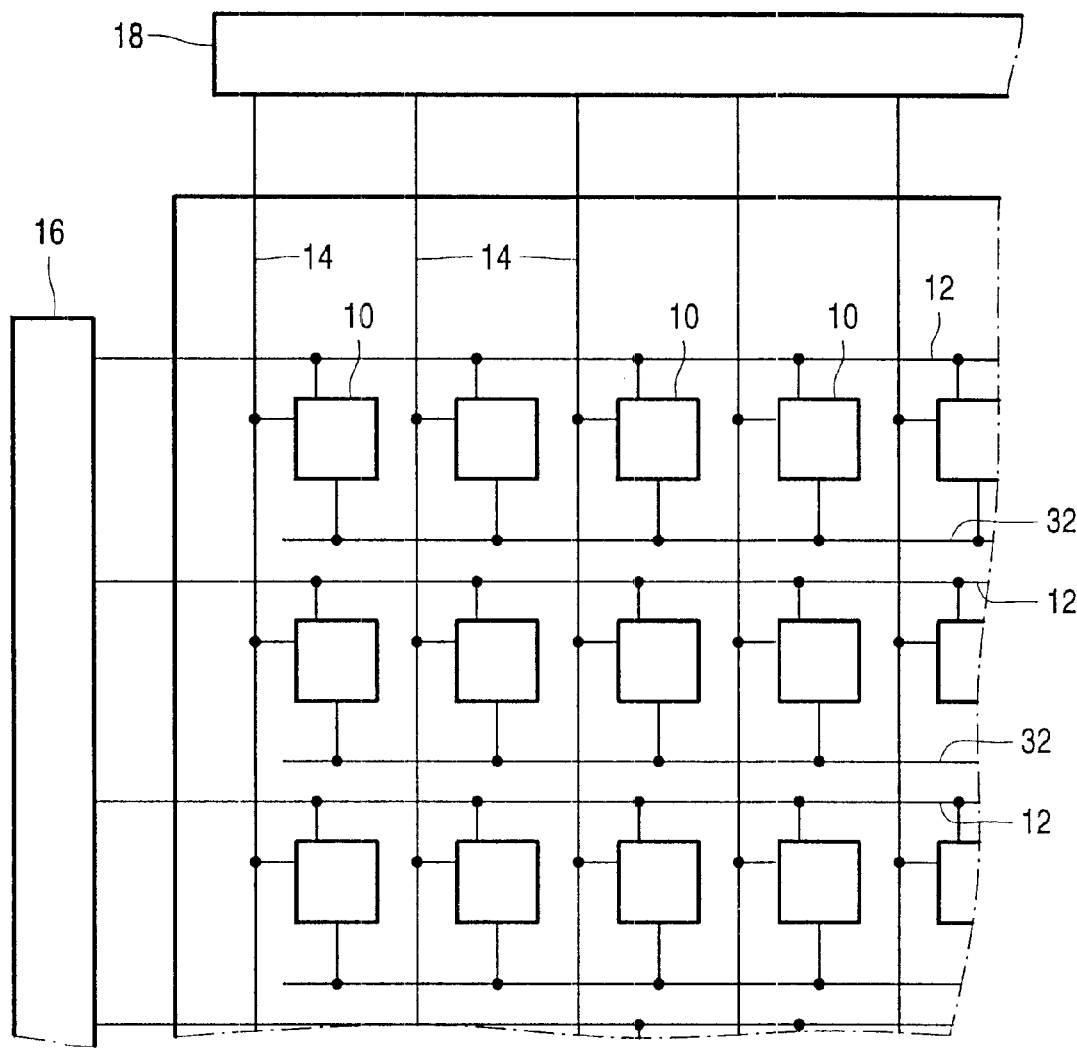
FIG. 1 is a simplified schematic diagram of an embodiment of an active matrix EL display device according to the present invention.

Referring to FIG. 1, the active matrix electroluminescent display device comprises a panel having a row and column matrix array of regularly-spaced pixels, denoted by the blocks 10, each comprising an electroluminescent display element and an associated driving device controlling the current through the display element, and which are located at the intersections between crossing sets of row (selection) and column (data) address conductors, or lines, 12 and 14. Only a few pixels are shown here for simplicity. The pixels 10 are addressed via the sets of address conductors by a peripheral drive circuit comprising a row, scanning, driver circuit 16 and a column, data, driver circuit 18 connected to the ends of the respective conductor sets.

Each row of pixels is addressed in turn in a frame period by means of a selection signal applied by the circuit 16 to the relevant row conductor 12 so as to load the pixels of the row with respective data signals, determining their individual display outputs in a frame period following the address period, according to the respective data signals supplied in parallel by the circuit 18 to the column conductors. As each row is addressed, the data signals are supplied by the circuit 18 in appropriate synchronisation.

Figure 2:
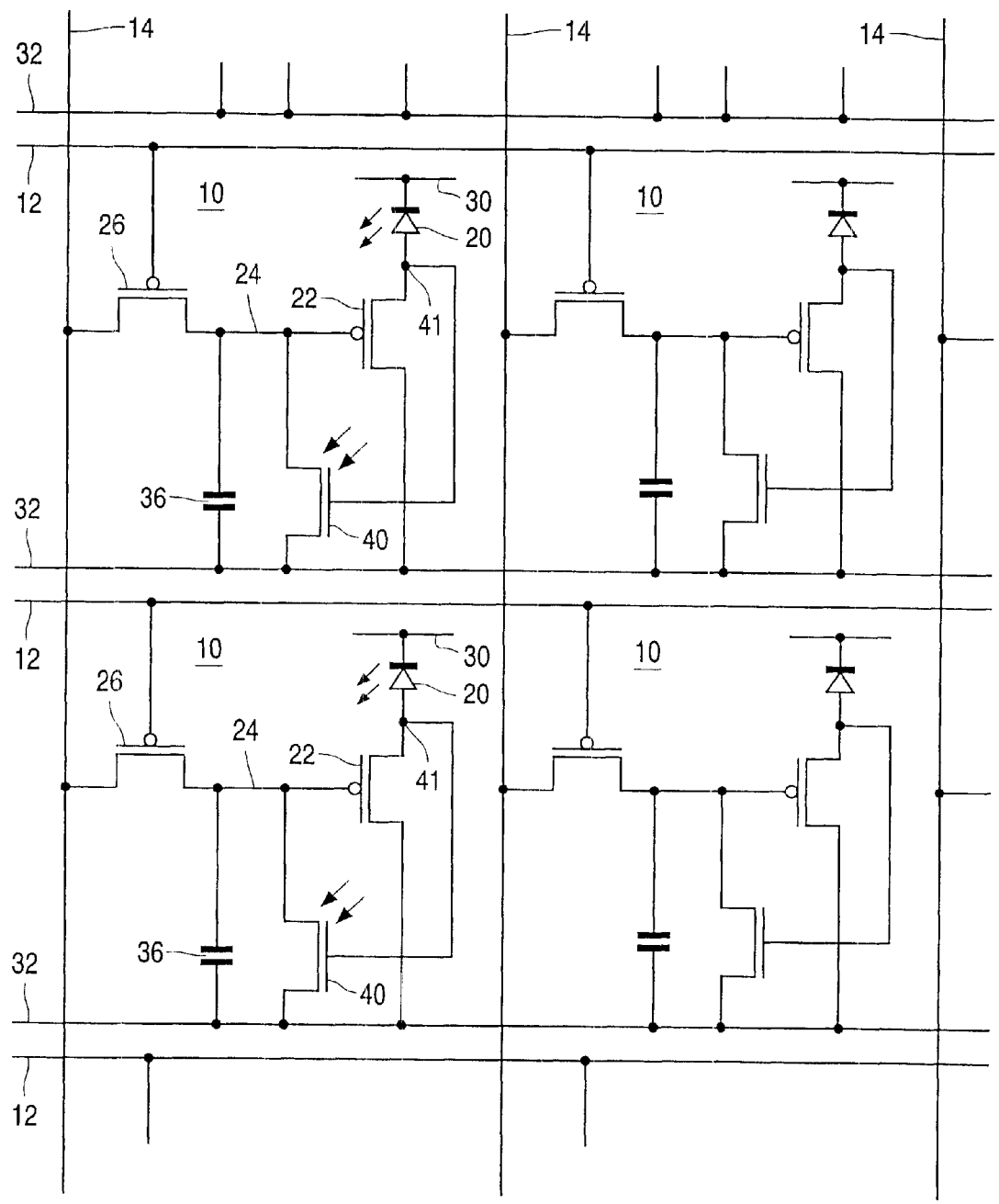
FIG. 2 shows the equivalent circuit of a few typical pixels in the device of FIG. 1.

FIG. 2 illustrates the circuit of a few, typical, pixels. Each pixel 10 includes a light emitting organic electroluminescent display element 20, represented here as a diode element (LED), and comprising a pair of electrodes between which one or more active layers of organic electroluminescent light-emitting material is sandwiched. In this particular embodiment the material comprises a polymer LED material, although other organic electroluminescent materials, such as low molecular weight materials, could be used. The display elements of the array are carried, together with the associated active matrix circuitry, on the surface of an insulating substrate. The substrate is of transparent material, for example glass, and the electrodes of the individual display elements 20 closest to the substrate consist of a transparent conductive material such as indium tin oxide (ITO) so that light generated by the electroluminescent layer is transmitted through these electrodes and the substrate so as to be visible to a viewer at the other side of the substrate. The cathodes of the display elements comprise a metal having a low work-function such as calcium, a magnesium silver alloy, or a barium/aluminum dual layer. Examples of suitable organic conjugated polymer materials which can be used are described in WO 96/36959. Examples of other, low molecular weight, organic materials are described in EP-A-0717446, which also describes the construction and operation of a typical known form of active matrix electroluminescent device and whose disclosure in these respects is incorporated herein by reference.

Each pixel 10 includes a driving device in the form of a low temperature polysilicon TFT 22, here of p-type conductivity, which is responsible for controlling the current through, and hence operation of, the display element 20 on the basis of a data signal voltage applied to the pixel. A data signal voltage for a pixel is supplied via a column conductor 14 which is shared between a respective column of pixels. The column conductor 14 is coupled to the gate of the current-controlling drive TFT 22 through an address TFT 26, also of p-type. The gates for the address TFTs 26 of a row of pixels are all connected to a common row conductor 12.

Each row of pixels 10 also shares a common voltage supply line 30 held at a predetermined potential, and normally provided as a continuous electrode common to all pixels, and a respective common current line 32. The display element 20 and the driving TFT 22 are connected in series between the voltage supply line 30 and the common current line 32 which acts as a current source for the current flowing through the display element 20. The line 30, for example, may be at ground potential and the line 32 at a positive potential around, for example, 12 V with respect to the supply line 30. The current through the display element 20 is regulated by the drive TFT 22 and is a function of the gate voltage on the TFT 22, which is dependent upon a stored control value determined by the data signal.

An individual row of pixels is selected and addressed by the row driver circuit 16 applying a selection pulse to its associated row conductor 12 which turns on the address TFTs 26 of the pixels and defines a respective row address period. A data signal, in the form of a voltage level derived from the video information supplied to the driver circuit 18 and applied to the column conductor 14 by the driver circuit 18, is transferred by the address TFT 26 to the gate node 24 of the drive TFT 22. At the end of the row address period the address transistor 26 turns off, and the voltage on the gate node 24 is retained by a pixel storage capacitor 36 connected between the gate of the TFT 22 and the common current line 32, so as to maintain the operation of the display element during the subsequent drive period.

The voltage between the gate of the TFT 22 and the common current line 32 determines the current passing through the display element 20, the current flowing through the display element being a function of the gate-source voltage of the drive TFT 22 (the source of the p-channel type TFT 22 being connected to the common current line 32, and the drain of the TFT 22 being connected to the display element 20). This current in turn controls the light output level (grey-scale) of the pixel. The TFT 22 is biased as a current source and operates in saturation, so that the current flowing through the TFT is insensitive to the drain-source voltage and dependent on the gate-source voltage. Consequently, slight variations of the drain voltage do not affect the current flowing through the display element 20. The voltage on the voltage supply line 30 is therefore not critical to the correct operation of the pixels.

Each row of pixels is addressed in turn in this manner in a respective row address panel so as to load the pixels of each row in sequence with their respective drive signals and set the pixels to provide desired display outputs during the subsequent drive period, corresponding approximately to a frame period, until they are next addressed.

In each pixel an opto-electronic arrangement is employed to compensate for effects of display element degradation, whereby the efficiency of its operation in terms of the light output level produced for a given drive current diminishes. Through such degradation display elements that have been driven longer and harder will exhibit reduced brightness, causing display non-uniformities. The opto-electronic arrangement counteracts these effects to an extent by controlling the integrated, total, light output from an element in a drive period accordingly. The pixel circuits are similar in this respect to those described in British Patent Application No. 0005811.5 to which reference is invited for a fuller description of such operation and whose disclosure in this respect is incorporated herein by reference. Briefly, electro-optical feedback is used to adjust the charge on the storage capacitor during the drive period by discharging the capacitor at a rate dependent on the instantaneous light emission of the display element during this period. Consequently, for a given data signal value the length of time for which a display element is energised to generate light during the drive period following the address period is regulated according to the subsisting drive current/light emission level characteristic of the display element, as well as the level of the applied data signal, such that the effects of degradation, particularly with regard to display non-uniformities, are reduced and the light output from individual pixels can then be substantially the same as would be obtained with a non-degraded display element if required.

Referring to FIG. 2 the electro-optic discharging means in this device comprises a gated photo-sensitive thin film device 40, which here is in the form of another TFT whose current-carrying, source and. drain, electrodes are connected across the storage capacitor 36, to the gate node 24 of the drive transistor 22 and the current line 32, and whose gate is connected to the node, 41, between the drive TFT 22 and the display element 20. In this particular embodiment, where the drive TFT 22 (and address TFT 26) comprises an p-type low temperature polysilicon MOS TFT, then the device 40 is of an opposite conductivity type, i.e a n-type polysilicon MOS TFT.

As will be described in greater detail, the pixel is constructed and arranged in such a way that the gated photo-sensitive device 40 is exposed to light emitted by the display element 20 in operation of the pixel. At the end of the addressing phase a voltage is set on the gate node 24 of the drive TFT 22, according to the level of the applied data signal, and the capacitor 36, charged to this voltage level, serves to maintain the gate voltage of the TFT 22, at least initially, in the subsequent drive phase. The drain junction of the photosensitive device 40 coupled to the line 32 is reverse biased and photo-responsive, and light emitted by the display element in the drive period causes a small photocurrent to be produced in the device 40 which is approximately linearly proportional to the display element's instantaneous light output level. The effect of this photocurrent is to slowly discharge the storage capacitor 36, the amount of photocurrent, and thus the rate of discharge, being dependent on the light output level of the display element. The gate of the TFT 40 is positively biased, with its voltage corresponding to the voltage at the node 41 and always zero or negative with respect to the node 24, and always negative with respect to the line 32, and this ensures that the TFT 40 is held in its off (non conductive) state. Accordingly, the transistor 40 behaves merely as a leakage device, in the manner of a reverse biased photodiode, which causes leakage of charge on the capacitor 36. The resultant discharging of the capacitor 36 in the drive period leads to the voltage on the gate of the drive TFT 22 gradually reducing which in turn progressively lowers the current flowing through the display element 20 with the light output of the display element gradually decreasing in corresponding fashion, until the TFT 22 approaches its threshold, turn-off, level. The reduction in current flowing through the display element 20 leads to a gradual increase in the (positive) voltage level at the node 41, although this merely ensures that the TFT 40 is continuously held off. When, eventually, the voltage on the gate node 24 drops to below the TFT's threshold voltage, the light output is terminated. As examples of typical voltages present in operation of the pixel, assuming for example that the TFT 22 has a −5 volt threshold, the voltage supply line 30 may be at around 0 volts, the common current line 32 may be at 12 volts, and as the voltage at the gate node of the transistor 22 changes from 4 to 12 volts the voltage at the node 41 can change from 4 volts to 0 volts.

By regulating the total, integrated, amount of light emitted by the display element within the drive period, which a viewer perceives as brightness, the effects of display element degradation can be counteracted. The integrated light output (brightness) is dependent on the length of time in the drive period for which the display element is energised as well as its initial light level. Because of the action of the discharging means in controlling the duration for which the display element is energised in the drive period, then different pixels in the array supplied with the same data signal value will tend to produce similar perceived brightness levels regardless of variations in the characteristics of their individual display elements due to degradation. In other words, the integral of the light outputs from individual display elements addressed with the same data signal value will be similar even though at the start of the drive period their respective light output levels may differ due to degradation effects. Improved uniformity of display output is thus obtainable.

As usual, the level of the applied data signal is adjusted appropriately to provide different grey-scale levels from the pixels. If the data signal, and thus charge on the gate node 24, is increased then more photons are required from the display element during the drive period before the TFT 22 is caused to switch off, so that a higher grey-scale level is achieved, and vice versa.

This manner of operation is effective also to compensate automatically for variations in the operational characteristics of the TFTs 22 of different pixels in the array resulting, for example, from variations in their threshold voltages, dimensions, and mobilities due to the nature of the thin film fabrication processes used to form the TFTs. Thus, further improvement in the uniformity of light output from the display elements over the array is achieved.

Figure 3:
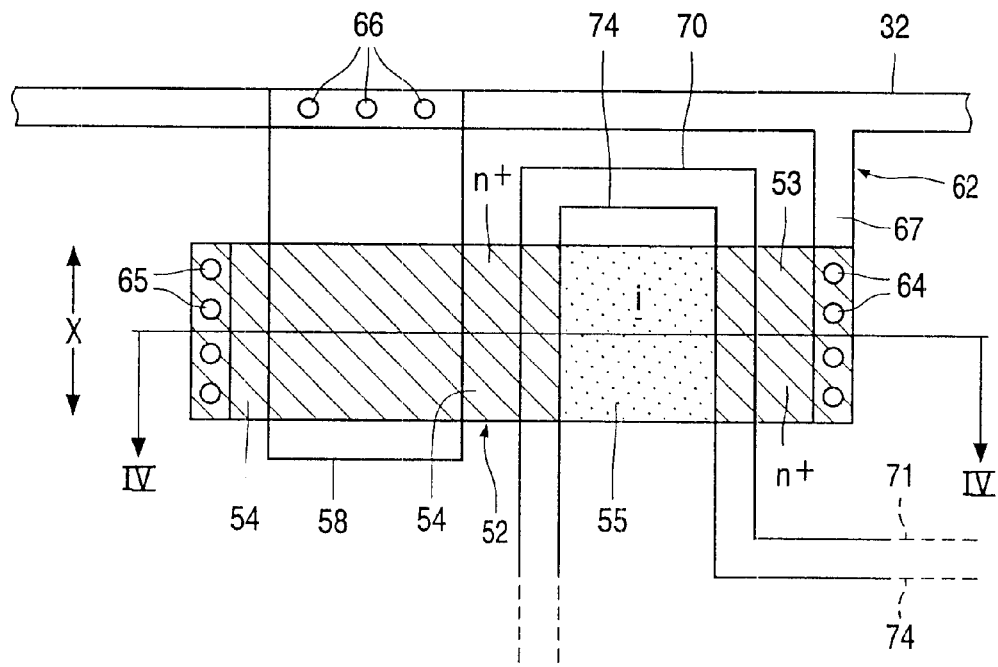
FIGS. 3 and 4 are respectively plan and sectional schematic views of part of a pixel.
Figure 4:
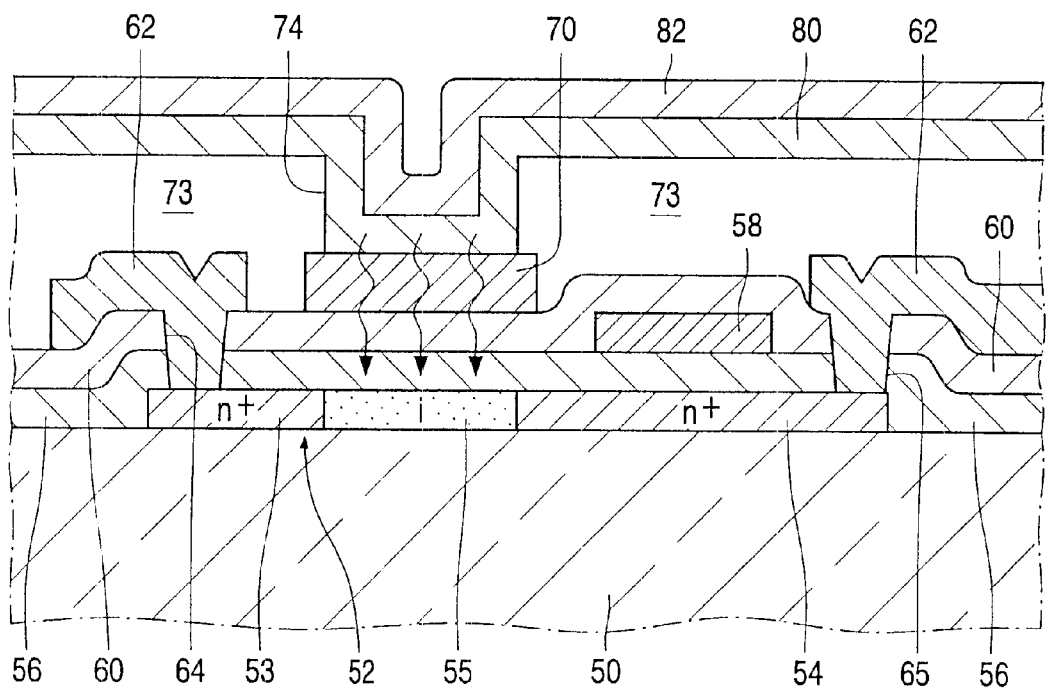

Referring now to FIGS. 3 and 4, there are shown schematic plan and sectional views through a part of a typical pixel including the photosensitive TFT 40 and illustrating the manner of the pixel construction at this region. FIG. 4 corresponds approximately to a sectional view along the lines IV—IV of FIG. 3. In addition to the TFT 40, the part shown includes a portion of the display element 20 and the storage capacitor 36, but does not encompass the addressing and drive TFTs 26 and 22. It will be appreciated though that these latter components are fabricated together with the components shown using the same processes and from common deposited layers.

On the transparent insulating substrate 50 a semiconductor island 52 of elongate strip form and comprising a layer of low temperature polysilicon material is provided. This is obtained by laser recrystallising a CVD deposited amorphous silicon layer and appropriately patterning this layer using a mask and photolithographic processing. The semiconductor strip is generally rectangular in shape, having substantially parallel major sides, and thus having substantially constant width along its length. The opposing end portions of this island are doped (n+) to constitute laterally—spaced drain and source contact electrode regions 53 and 54 respectively which are separated by a co-planar region of intrinsic semiconductor material 55 forming a gate controlled, channel, region of the TFT 40. Corresponding, similarly-shaped, islands of polysilicon are formed at other intended pixel locations on the substrate at the same time and together with semiconductor islands for the addressing and drive TFTs 26 and 22, although the regions of these latter TFTs constituting source and drain electrodes are oppositely doped (p+type) instead. An insulating layer 56, for example of silicon dioxide or nitride, is deposited continuously over the substrate to cover these islands and serve as a gate dielectric layer.

A layer of metal, for example of aluminum, or an aluminum alloy, is deposited over the layer 56 and patterned to leave regions constituting the gates (not shown) of the TFTs 26 and 22 and a region 58 overlying the (source) region 54 at each photosensitive TFT location. At the same time, required interconnection lines are formed from this metal layer. As is apparent from FIGS. 3 and 4, the region 58 is defined as a rectangular finger or strip extending substantially transversely of the semiconductor island 52. At the region of their cross-over, therefore, both the island 52 and the finger 58 are parallel-sided and of substantially constant width. Together, the overlying portions of the metal finger 58 and the n+ region 54 and the intervening portion of the dielectric layer 56 constitute the pixel's storage capacitance 36, whose capacitance value is determined by the cross-over area between the finger 58 and the island 52 and the thickness and dielectric constant of the layer 56.

Another dielectric layer 60, e.g of silicon oxide or nitride, is formed over this structure covering, inter alia, the defined regions 58 of the metal layer. A further metallisation layer is then deposited and patterned to leave regions 62 forming the current lines 32 and other required interconnections. Prior to depositing this layer, contact openings 64 and 65 are formed by etching through both the dielectric layers 56 and 60 over the drain region 53 and the source region 54 and contact openings 66 are formed through the layer 60 over an end portion of the region 58 so that, following deposition and patterning of this metal, interconnections are provided between the current line 32, via an integral extension arm 67, and the drain electrode 53, between the source region 54 and the gate node 24 via a part of the metallisation 62 forming the current lines (through further contact openings which are not shown), and between the current line 32 and the metal finger 58.

Transparent conductive material such as ITO is then deposited and patterned to leave regions constituting lower (anode) electrodes for the display elements which are appropriately shaped to define the desired shape of the display elements. A portion of this electrode forms an integral leg 70 which extends away from the main display element area 71 (only a small part of which is shown) and transversely over the semiconductor island 52 directly above the gate controlled region 55 and the drain junction.

A further, relatively thick and continuous, dielectric layer 73 e.g of silicon nitride or an even thicker (1–2 μm) insulating polymer layer is deposited completely over the structure and openings 74 are formed in this layer above the patterned ITO regions both at the legs 70 and main display element areas.

The polymer light emitting material is then deposited, for example by spin coating, as a continuous layer 80 extending over the dielectric layer 73 and into the openings 74 formed therein so as to contact directly with the underlying ITO. Over this layer 80, a continuous layer 82 of calcium, magnesium silver alloy or barium/aluminum is deposited to form a common electrode layer constituting the display element cathode electrodes and the supply lines 30.

Each display element 20 consists of a respective region 71 of ITO together with overlying portions of the layers 80 and 82 and it will be appreciated that the integral ITO leg 70 together with the immediately overlying parts of the layers 80 and 82 form an integral extension of the display element which with the main display element region emits light upon a suitable potential difference being applied between the bottom and top electrodes.

The portion of the ITO leg 70 immediately overlying the gate controlled region 55 serves as the gate of the photosensitive TFT 40 with the underlying combined layers 56 and 60 providing the gate dielectric.

In operation of the pixel, light emitted by the layer 80 upon current being passed between the electrodes 71 and 82 is transmitted through the ITO lower electrode and the substrate 50 to produce a display output. The leg of the display element similarly produces light and this passes through the ITO extension 70 and the underlying, transparent, dielectric layers 56 and 60 so as to be incident on the gate controlled region 55 of the photosensitive TFT 40. The light falling on the drain junction particularly is responsible for photocurrent being generated. Thus, as a result of the display element leg extending over the region 55, and the light emitting polymer material 80 being immediately above the gate of TFT 40 and directly emitting light into the TFT structure, good optical coupling between the display element and the photosensitive TFT 40 is ensured and achieved in simple and reliable manner.

Moreover, as the gate of the TFT 40 is constituted by a portion of the display element anode, then the gate is always at the required (negative) bias with respect to both source and drain to ensure that the TFT 40 is held off (i.e in its high resistance, non-conducting, state) and that only leakage currents due to generated photocurrents flow between its source and drain electrodes.

The relationship between the photosensitive TFT 40 and the storage capacitance 36 in terms of the level of photocurrent generated in response to typical input light levels and the amounts of charge stored on the storage capacitor 36 needs to be closely controlled in order for the electro-optic feedback control to be implemented most effectively. The active area of the TFT 40 in this respect comprises the edge of a lateral (n+-i) drain junction and it is only this comparatively narrow area at the drain junction which contributes a photocurrent. The active area is basically equivalent to a photodiode and desirably should be very small in order to ensure the typical levels of photocurrent generated are sufficiently low to control the gate potential of the drive TFT 22 in the manner required over the drive (frame) period and avoid the need to use a larger storage capacitor. Because the storage capacitor 36 uses in its structure only the layer 56 as the capacitor dielectric then the area required for the capacitor structure to provide a given capacitance value is much smaller than would be the case if both the layers 56 and 60 were used.

When using thin film technology it can be difficult to form components with very precise dimensional values because of the nature of the processes employed to define the components, e.g. the masking and etching steps used in photolithographic patterning processes. It will be appreciated that in the above-described structure the storage capacitor 36 and the photosensitive TFT 40 both share the same critical layer, namely the semiconductor island 52 and are spatially close. Accordingly, any line width variations in this part due to manufacturing tolerances will be common to both. Because this critical geometry, i.e the width of the strip-shape island 52 as indicated by X in FIG. 3, is constant for both the TFT 40 and the storage capacitor then any deviation in this physical dimension of this common part from the intended value will affect both the active area of the TFT and the capacitance value of the storage capacitor in a similar, corresponding fashion. More precisely, the active area of the TFT and the capacitance value scale together. Any variation in the width of the island 52 tending to increase the size, and hence capacitance, of the storage capacitor will result in the size of active area of the TFT also being increased, and vice versa, so that the balance between the electrical characteristics of these two components will be maintained. Thus, the desired, and predetermined, inter-relationship of these two components is ensured.

A gated lateral p-i-n diode may conveniently be used in place of the TFT

The structure of such a device would be generally similar to that shown in FIG. 3 except that the region 53 of the semiconductor island 52 would be doped oppositely to the region 54, i.e. p+ type. In reverse bias, the p+ region 53 is more positive than the n+ region 54. In this case, light incident across the whole device can generate photocurrent. The photo-active junction thus will extend to a greater distance across the device than is the case with the previous, TFT, structure.

In the above described pixel embodiment, the photosensitive TFT 40 is of opposite conductivity type to both the address TFT 26 and the drive TFT 22, and by virtue of the manner in which the gate of the TFT 40 is biased it is ensured that the TFT 40 is held off and acts simply in the manner of a reverse-biased photodiode to leak charge on the capacitor 26 during the drive period.

However, in an alternative form of this pixel circuit, the TFT 40 may be of the same type as the drive TFT 22 and operable also as a switching device rather than solely a leakage device. In operation of this alternative circuit, then initially at least in the drive period the gate potential, corresponding to the display element lower electrode/node 41 potential, will be such as to ensure that the TFT behaves as a simple, reverse-biased, leakage device. As this discharging continues then the consequential reduction in current flowing through the display element will lead to a gradual increase in the (negative) voltage level at the node 41 (FIG. 2). When the current level attains a certain lower limit, the voltage at the node 41 relative to the line 32 will reach the threshold voltage of the TFT 40 causing it to turn on (conduct) abruptly and rapidly discharge the capacitor 26 so that the drive TFT 22 turns off and energisation of the display element is terminated. The switching operation of the TFT 40 in this manner has the advantage that the light output of the display element is determined in a more precisely controller manner. Without such switching, the turning off of the display element could be less well controlled due to the fact that the behaviour of the photosensitive TFT 22 in response to comparatively low light input levels, as would occur towards the end of the display element's energisation phase, becomes less well defined and less predictable.

The photosensitive TFT 40 desirably is shielded from the effects of ambient light falling thereon so that any photocurrent is due solely to light emitted from the display element. To this end, the metal electrode layer 82 serves to shield the device from ambient light at one side of the panel. Shielding of light from the other side, through the transparent substrate 50, could be achieved by depositing a light shield layer between the semiconductor island 52 and the substrate surface.

Figure 5:
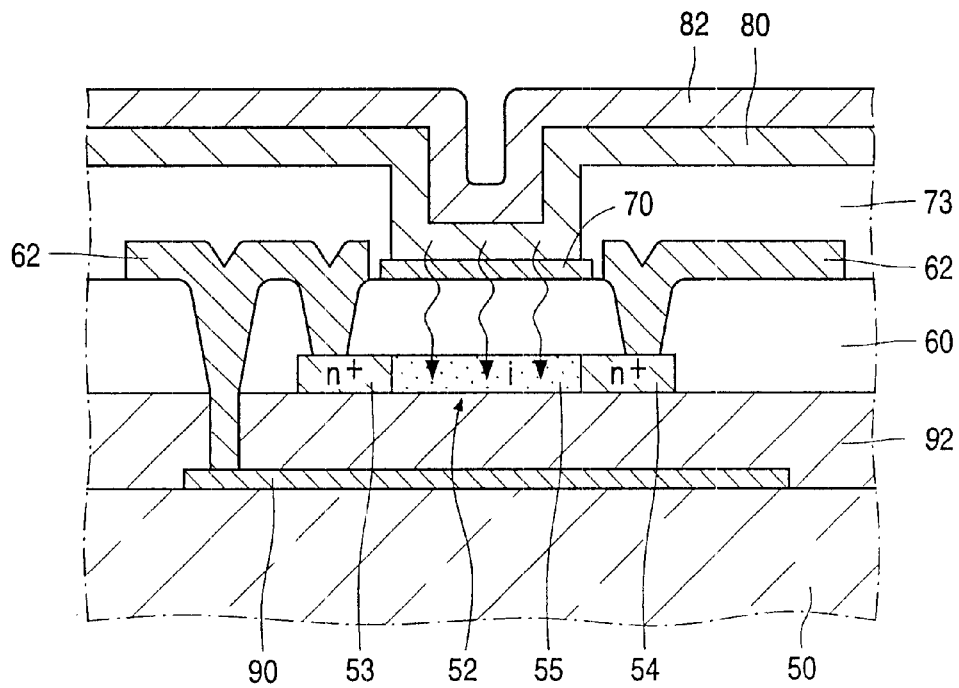
FIG. 5 is a schematic view through a part of an alternative form of pixel in a further embodiment.

Preferably, however, in another embodiment of device according to the invention, the structure of the pixel is modified so that a part of the storage capacitor structure is employed also to act as a light shield. FIG. 5 illustrates schematically a section through a part of the modified pixel structure for comparison with FIG. 4. In this structure, a metal layer is deposited on the surface of the substrate 50 and patterned to form at each pixel a light shield 90 whose overall dimensions are slightly greater than those of the subsequently formed semiconductor island 52 used for the TFT 40 (or alternatively a lateral pin diode). An insulating layer 92, for example of silicon nitride, is deposited as a continuous layer completely over the substrate surface and those metal layers 90 to form a planar surface upon which the pixel structure is then fabricated generally as previously described but in this case with the metal finger 58 previously used being omitted and with the portion of the metal layer 62 used to contact the region 53 of the semiconductor island 52 being arranged also to contact one end of the light shield layer 90 through the dielectric layers 60 and 92 via a contact hole formed in these layers away from the island 52. The dielectric layer 56 is not necessary in this version.

Figure 6:
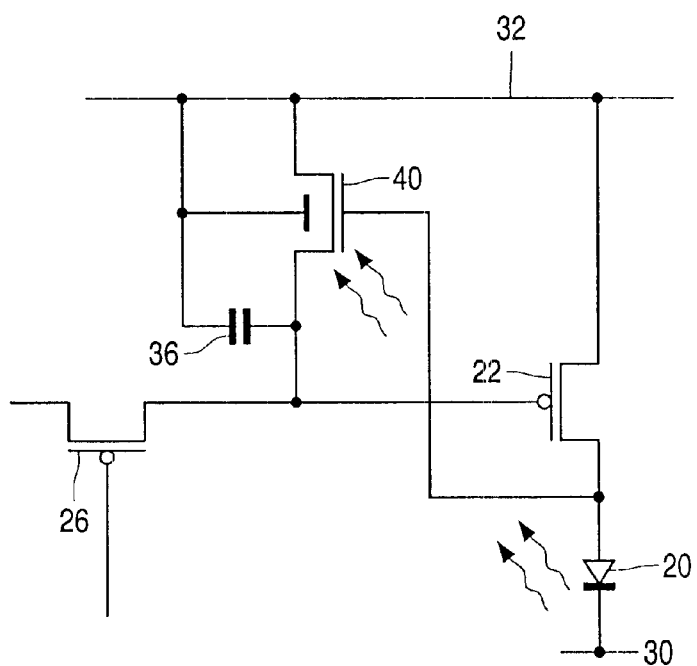
FIG. 6 shows the equivalent circuit of a typical pixel in the further embodiment.

In this construction, the storage capacitor 36 is formed by the part of the light shield layer 90 overlying contact region 54 of the island 52 together with the portion of the insulating layer 92 sandwiched therebetween which provides the dielectric. The equivalent circuit of this pixel is shown in FIG. 6. The photosensitive TFT 40 in this case effectively has a double gate, with the light shield 90 constituting a bottom gate. This second gate will be positive with respect to the channel 55 and so the insulating layer 92 is required to be sufficiently thick to ensure that the TFT's threshold level is not reached and that the TFT is prevented from being turned on.

Instead of overlying the island 52 completely as in the above arrangement, the layer 90 may be configured such that it adequately covers the photo-active region 53 of the TFT 40 for light shielding purposes by extending completely over the region of the drain junction and over the source region 54 to form the capacitor but does not extend to any significant extent over the channel region. To this end, the layer 90 may have a central aperture overlying the channel region 55 bounded and by integral arms extending parallel to the island to either side of the channel region so that the regions of the layer 90 overlying the two contact regions are interconnected. With this arrangement, then because the layer does not extend directly over the channel region 55 the risk of it acting as a second gate is avoided.

In this other embodiment, then again the TFT 40 and storage capacitor 36 both share the same critical layer, i.e the island 52, so that any spatial variation due to fabrication process tolerances are common to both components and they scale together.

The invention can be used also with pixels driven using a current data signal rather than a voltage data signal as in the above-described embodiments, for example in the manner described in WO 99/65012.

In summary, a display device has an array of pixels comprising light emitting display elements, for example EL elements, carried on a substrate and associated light sensing elements responsive to light emitted by the display elements. The light sensing elements each comprise a gated photosensitive thin film device such as a TFT structure or a lateral gated pin device having a semiconductor layer with contact regions laterally spaced on the substrate and separated by a gate controlled region. A part of the associated display element extends over the gate controlled region with an electrode of the display element serving as the gate of the photosensitive device thereby ensuring good optical coupling between the display element and the photosensitive device and enabling the gate to be appropriately biased. Such an arrangement enables, for example, the provision of electro-optic feedback control in the pixel in comparatively simple manner.

From reading the present disclosure, other modifications will be apparent to persons skilled in the art. Such modifications may involve other features which are already known in the field of active matrix electroluminescent display devices and component parts therefor and which may be used instead of or in addition to features already described herein.

We claim:

1. A light-emitting display device comprising on a substrate an array of addressable pixels each comprising a light-emitting display element having a layer of light-emitting material with a transparent electrode on one side thereof, and a light sensing element responsive to light emitted by the display element, wherein each light sensing element is a gated photosensitive thin film device comprising a semiconductor layer having contact regions laterally spaced on the substrate and an intervening gate controlled region over which dielectric material is disposed, and wherein a part of the light-emitting display element extends over the dielectric material and the gate controlled region such that the transparent electrode of the light-emitting display element at that part serves as the gate of the photosensitive device and light emitted by the light-emitting material layer is incident on the semiconductor layer.

2. A light-emitting display device according to claim 1, characterised in that the gated photosensitive device comprises a thin film transistor having laterally—spaced source and drain contact regions of doped semiconductor material and a region of intrinsic semiconductor material extending between the contact regions forming the gate controlled region.

3. The light-emitting display device of claim 2, wherein the photosensitive device is operable as a switch and arranged to turn on in response to the potential level of the transparent electrode of the display element in the driving period reaching a threshold level to provide a conductive path between its contact regions and rapidly discharge the storage capacitor.

4. The light-emitting display device of claim 3, wherein the light-emitting material of the display elements comprises electroluminescent material.

5. The light-emitting display device of claim 2, wherein the light-emitting material of the display elements comprises electroluminescent material.

6. A light-emitting display device according to claim 1, characterised in that the photosensitive device comprises a gated pin diode device having laterally spaced contact regions of oppositely doped type semiconductor material and a region of intrinsic semiconductor material extending between the contact regions forming the gate controlled region.

7. The light-emitting display device of claim 6, wherein the light-emitting material of the display elements comprises electroluminescent material.

8. A light-emitting display device according to any one of claims 1 to 3, characterised in that the transparent electrode of the light-emitting element is arranged in operation of the device to be biased such that current flow in the gate controlled region is due to generated photocurrents.

9. light-emitting display device according to claim 8, characterised in that the display element is current driven and current through the display element in a drive period is controlled by a thin film transistor based on a drive signal applied to the pixel during a preceding address period and stored as a charge on a storage capacitor coupled to the gate of the transistor, and in that the photosensitive device is coupled to the storage capacitor and acts as a charge leakage device in response to photocurrents generated therein to regulate the charge on the storage capacitor in accordance with the display element's light output.

10. The light-emitting display device of claim 9, wherein the photosensitive device is operable as a switch and arranged to turn on in response to the potential level of the transparent electrode of the display element in the driving period reaching a threshold level to provide a conductive path between its contact regions and rapidly discharge the storage capacitor.

11. The light-emitting display device of claim 10, wherein the light-emitting material of the display elements comprises electroluminescent material.

12. The light-emitting display device of claim 9, wherein the light-emitting material of the display elements comprises electroluminescent material.

13. The light-emitting display device of claim 8, wherein the light-emitting material of the display elements comprises electroluminescent material.

14. The light-emitting display device of claim 1, wherein the light-emitting material of the display elements comprises electroluminescent material.

* * * * *

UNITED STATES PATENT AND TRADEMARK OFFICE
CERTIFICATE OF CORRECTION

PATENT NO. : 6,489,631 B2
DATED : December 3, 2002
INVENTOR(S) : Nigel D. Young and John M. Shannon It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-second Day of April, 2003

JAMES E. ROGAN
*Director of the United States Patent and Trademark Office*